(12) United States Patent
Lester et al.

(10) Patent No.: US 7,512,391 B2
(45) Date of Patent: Mar. 31, 2009

(54) SELF-ALIGNING RESONATOR FILTER CIRCUIT AND WIDEBAND TUNER CIRCUIT INCORPORATING SAME

(75) Inventors: David P. Lester, Phoenix, AZ (US);
Allan P. Chin, Phoenix, AZ (US);
Luciano Zoso, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 529 days.

(21) Appl. No.: 11/136,752

(22) Filed: May 24, 2005

(65) Prior Publication Data

US 2006/0270374 A1    Nov. 30, 2006

(51) Int. Cl.
*H04B 1/06* (2006.01)

(52) U.S. Cl. .................... 455/260; 455/306; 455/340; 333/205; 333/219

(58) Field of Classification Search ......... 455/255–260, 455/303–307, 318, 333, 334, 338–340; 333/202–207, 333/219
See application file for complete search history.

(56) References Cited

U.S. PATENT DOCUMENTS

| 4,851,796 | A  |   | 7/1989  | Hendricks |         |
|-----------|----|---|---------|-----------|---------|
| 5,982,243 | A  | * | 11/1999 | Pope      | 331/59  |
| 6,411,168 | B2 | * | 6/2002  | Yoshida   | 331/49  |
| 6,426,680 | B1 |   | 7/2002  | Duncan et al. | |
| 6,724,440 | B1 |   | 4/2004  | Suan et al. |   |
| 6,734,761 | B2 |   | 5/2004  | Sim       |         |
| 6,750,734 | B2 |   | 6/2004  | Utsunomiya et al. | |
| 6,784,766 | B2 | * | 8/2004  | Allison et al. | 333/205 |
| 6,795,696 | B2 |   | 9/2004  | Krug      |         |
| 7,038,550 | B2 | * | 5/2006  | Arigliano | 331/109 |

OTHER PUBLICATIONS

International Search Report from corresponding PCT Application No. PCT/US06/10743 dated Sep. 25, 2007.

\* cited by examiner

*Primary Examiner*—Nhan T Le
(74) *Attorney, Agent, or Firm*—Ingrassia, Fisher & Lorenz, P.C.

(57) ABSTRACT

A self-aligning resonator filter, a self-aligning coupled resonator filter circuit, and a television tuner circuit incorporating the filter and the circuit are disclosed herein. The self-aligning resonator filter leverages the local oscillator of the tuner circuit and can be realized with a significant reduction in the amount of off-chip components. The self-aligning resonator filter is configured to align its tunable resonator to resonate at a desired frequency in response to a phase difference measured across a resistance element during a tuning mode, and the resistance element is switched out of the self-aligning resonator filter during a run mode. The self-aligning coupled resonator filter circuit is configured to isolate its individual resonator stages during tuning such that each resonator stage can be aligned without being influenced by the other resonator stage. The television tuner circuit can be manufactured at relatively low cost while retaining high performance and the ability to be dynamically aligned while in use.

15 Claims, 7 Drawing Sheets

FIG. 1 —PRIOR ART—

SELF-ALIGNING RESONATOR FILTER CIRCUIT AND WIDEBAND TUNER CIRCUIT INCORPORATING SAME

TECHNICAL FIELD

The present invention relates generally to electronic circuits. More particularly, the present invention relates to a tuner circuit suitable for use in a television receiver.

BACKGROUND

The prior art is replete with television tuner systems, circuits, and components. The tuner is the radio frequency ("RF") input stage of a television receiver, and the role of the tuner is to select a desired channel while suppressing all other channels and undesired RF signals. The selection is usually accomplished with the use of three tunable filters and one or two fixed filters. The three tunable filters typically utilize a single tuned low loss stage that feeds an amplifier and a higher selectivity, higher loss double tuned stage following the amplifier. The fixed tuned filter(s) follow the down conversion or mixer stage.

It is not practical to tune a stage over the complete frequency range needed to support television reception. Thus, a conventional tuner divides the television frequency range into three bands (UHF, VHFH, and VHFL), each having its own set of tunable filters for a total of nine tunable stages. In normal operation, the channel selection is accomplished by tuning the RF filters to the desired frequency and setting the local oscillator to a frequency that differs from the desired frequency by the intermediate frequency ("IF") center frequency.

Conventional single conversion television tuners are aligned by physically adjusting a number of coil inductors at the manufacturing facility. The manual alignment procedure, which must be performed for nine tunable filters in many practical tuners, is labor intensive, requires expensive testing equipment, and is costly. In addition, the factory settings of such television tuners may be susceptible to drift caused by age, temperature variation, and physical handling. Due to the fixed nature of such factory settings, excessive drift of the tunable filters may result in a degradation in tuner performance.

Accordingly, it is desirable to have a low cost television tuner circuit that eliminates the need for precision factory alignment. In addition, it is desirable to have a television tuner circuit that will self-align at the time of use or periodically over its lifespan to reduce the adverse effects that would otherwise be caused by component drift and variation. Furthermore, other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
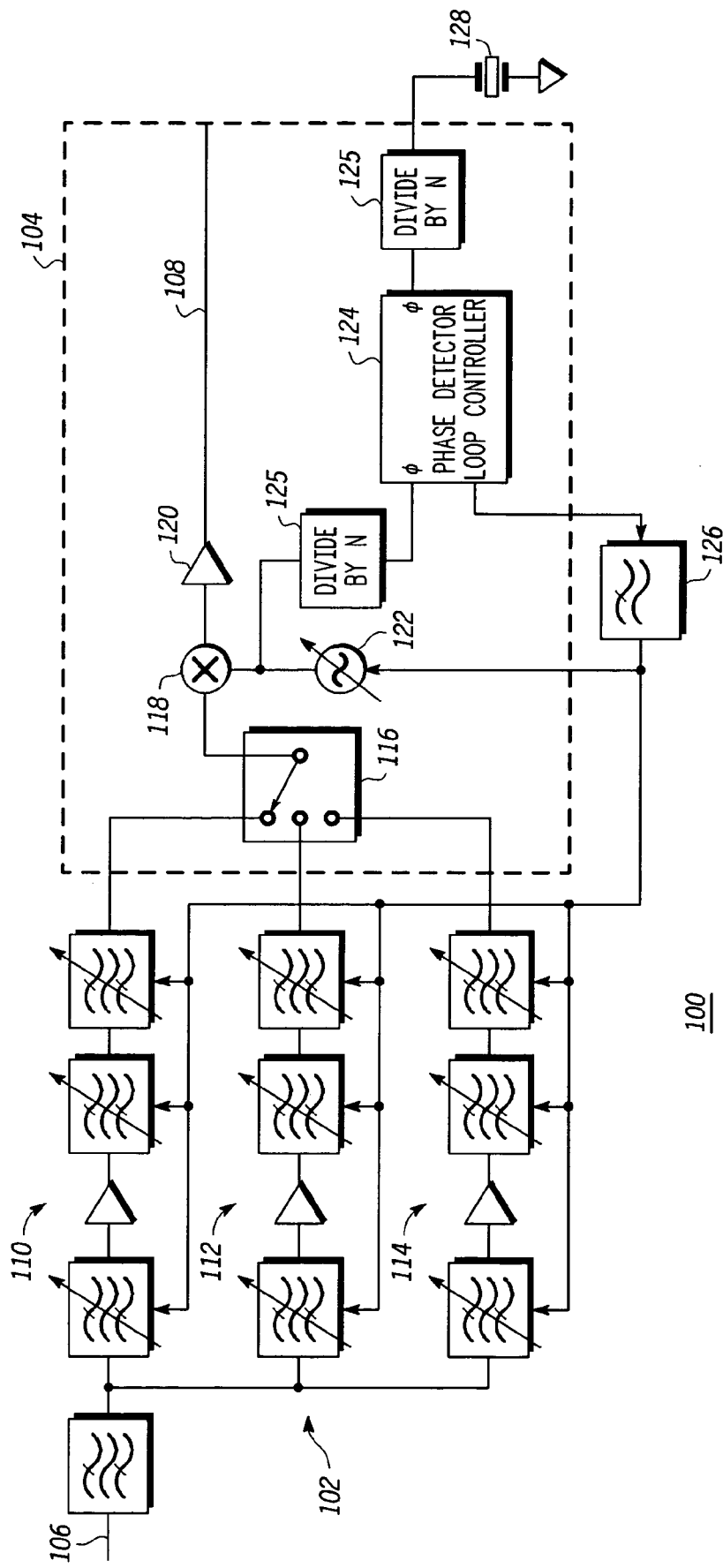
FIG. 1 is a schematic circuit diagram of a prior art single conversion television tuner.

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, logic elements, look-up tables, or the like, which may carry out a variety of functions under the control of one or more microprocessors or other control devices. In addition, those skilled in the art will appreciate that the present invention may be practiced in conjunction with any number of wideband radio receiver applications and that the television tuner circuit described herein is merely one exemplary application for the invention.

For the sake of brevity, conventional techniques related to television signal reception and processing, resonator filter design, phase detection, RF switching, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common mode).

The following description refers to nodes or features being "connected" or "coupled" together. As used herein, unless expressly stated otherwise, "coupled" means that one node/feature is directly or indirectly coupled to another node/feature, and not necessarily physically. As used herein, unless expressly stated otherwise, "connected" means that one node/feature is directly connected to another node/feature. In particular, a switch may be "coupled" to a plurality of nodes, but all of those nodes need not always be "connected" to each other; the switch may connect different nodes to each other depending upon the state of the switch. Furthermore, although the various schematics shown herein depict certain example arrangements of elements, additional intervening elements, devices, features, or components may be present in an actual embodiment (assuming that the functionality of the given circuit is not adversely affected).

FIG. 1 is a schematic circuit diagram of a prior art single conversion television tuner 100. Tuner 100 generally includes a tunable resonator filter section 102 and a mixer oscillator PLL ("MOP") integrated circuit ("IC") 104, which is represented by the dashed lines in FIG. 1. In the context of television tuner 100, the components in MOP IC 104 are considered "on-chip" components and the remaining components are considered "off-chip" components. Generally, television tuner 100 receives a wideband broadcast television signal at a tuner input 106 and processes the input signal to obtain a desired output signal that corresponds to the selected viewing channel. The output signal is provided at a tuner output 108.

Filter section 102 is divided to provide tunable filtering for three bands (UHF, VHFH, and VHFL). In this regard, filter section 102 includes a UHF branch 110, a VHFH branch 112, and a VHFL branch 114. Each branch includes three tunable resonator filters that are adjusted in accordance with the selected viewing channel. Television tuner 100 selects one of the three branches via a switch 116 that is controlled by MOP IC 104 in accordance with the selected viewing channel.

MOP IC 104 generally includes switch 116, a mixer 118, an amplifier 120, a local oscillator 122, a phase detector loop controller 124, and divider elements 125. Television tuner 100 also includes an off-chip PLL loop filter 126 and an off-chip frequency reference such as a crystal 128. These components are controlled to function in accordance with well known RF receiver methodologies and the fundamental operation of MOP IC 104 and television tuner 100 will not be described in detail herein. Briefly, television tuner 100 sets switch 116, adjusts the frequency of local oscillator 122, and tunes the selected branch of filter section 102 in response to the selected viewing channel. Once television tuner 100 is tuned to the selected viewing channel, the selected branch of filter section 102 attenuates the image frequency of the desired channel frequency and switch 116 provides the filtered input signal to mixer 118. Mixer 118 processes the filtered input signal and generates the desired intermediate frequency ("IF") signal for use as an input to amplifier 120.

Each resonator filter in filter section 102 (nine total) is typically adjusted at the manufacturing facility during production of television tuner 100. The resonator filters must be aligned such that they properly track the local oscillator control voltage versus frequency. After the initial factory alignment, tuning is performed in an open loop manner where control signals to filter section 102 are sent, but no measurements are taken. The labor cost associated with manual tuning, drifting of the resonator filters over time, performance differences with frequency variation, and unit-to-unit performance differences are practical issues associated with this type of television tuner 100.

A tuner configured in accordance with an example embodiment of the invention generally operates as described above in connection with television tuner 100. Such a tuner, however, employs self-aligning resonator filter circuits that can be fabricated on-chip. The tuner utilizes the local oscillator as a test signal source and a simple comparator that measures the phase shift of the resonator filter circuits to determine when the resonator filter circuits have been tuned to their correct resonant frequencies. The tuner topology eliminates the need for precision factory alignment by using the local oscillator as an internal test signal source in conjunction with a detector and a tuning drive circuit that is very easy to implement. The tuner also experiences improved performance relative to mechanically tuned tuners because each channel/frequency selection can be optimized at the time of use (rather than relying on the long term stability of factory alignment). In this regard, the tuner employs a closed loop deterministic tuning scheme that can be performed each time a channel is selected, at each power-up cycle, or whenever deemed necessary.

Figure 2:
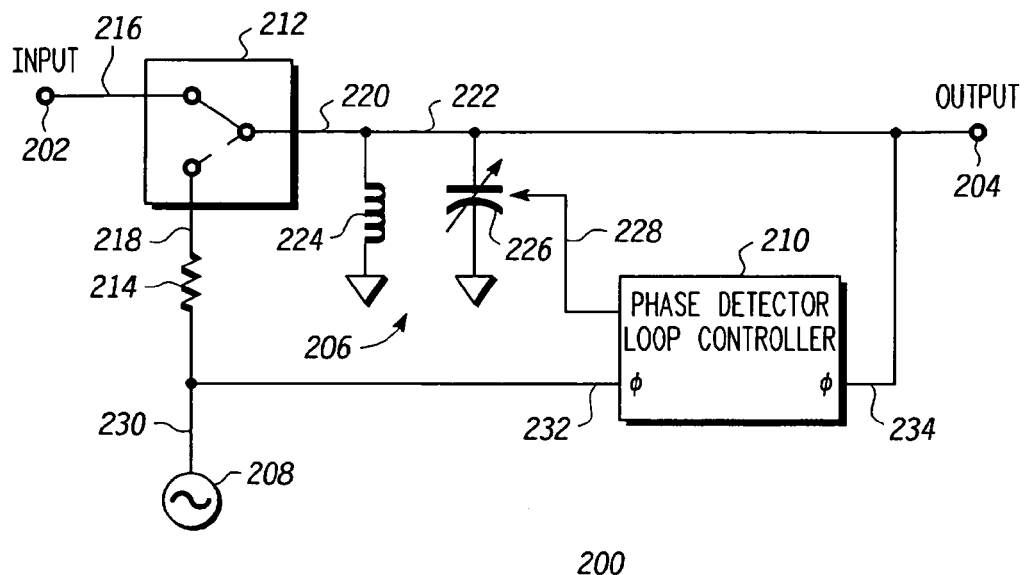
FIG. 2 is a schematic circuit diagram of a resonator filter circuit configured in accordance with an example embodiment of the invention.

As mentioned above, a tuner configured in accordance with a practical embodiment of the invention may employ a number of self-aligning resonator filter circuits. In this regard, FIG. 2 is a schematic circuit diagram of a self-aligning resonator filter circuit 200 configured in accordance with an example embodiment of the invention. In practice, nine instantiations of resonator filter circuit 200 may be utilized in a single conversion television tuner having three bands (see television tuner 100 for example).

Resonator filter circuit 200 generally includes a circuit input node 202, a circuit output node 204, a tunable resonator 206, an oscillator 208, a phase detector loop controller 210, a switch 212, and a resistance element 214. Circuit input node 202 receives an input signal and circuit output node 204 provides a filtered output signal that is based upon the input signal. Switch 212, which is a single pole double throw switch in this example, has a first input 216 coupled to circuit input node 202, a second input 218 coupled to resistance element 214, and a common output node 220 coupled to tunable resonator 206 and to circuit output node 204. Switch 212 is controllable to switch between a run state corresponding to a run mode for resonator filter circuit 200 and a tuning state corresponding to a tuning mode for resonator filter circuit 200. In FIG. 2, the solid line in switch 212 represents the run state and the dashed line in switch 212 represents the tuning state.

Tunable resonator 206 includes a filter output node 222 coupled to circuit output node 204 (in this example embodiment, filter output node 222 corresponds to circuit output node 204). Although not a requirement of the invention, tunable resonator 206 includes an inductance element 224 in parallel with a variable capacitance element 226. The specific value of inductance element 224 and the range of capacitance of variable capacitance element 226 are selected to suit the needs of the given application. For a typical television tuner application, inductance element 224 may have a value between 30 nH and 1000 nH, and variable capacitance element 226 may have an adjustable capacitance range between 2 pF and 30 pF. In this example circuit, inductance element 224 and variable capacitance element 226 are each coupled between filter output node 222 and ground. In practice, due to its relatively large physical size, inductance element 224 may be an off-chip component of resonator filter circuit 200 (all other components shown in FIG. 2 can be on-chip components). Variable capacitance element 226 is preferably realized as an on-chip varactor, a switched capacitance array, or the like, that is adjusted in response to a control signal 228 provided by phase detector loop controller 210.

Oscillator 208, which may be the local oscillator utilized by the tuner or receiver that incorporates resonator filter circuit 200, has an oscillator output node 230. Oscillator 208 is suitably configured and controlled to generate a tuning signal at oscillator output node 230, where the tuning signal is generated at a reference frequency when resonator filter circuit 200 is in the tuning mode. Oscillator output node 230 may be coupled to a first input 232 of phase detector loop controller 210, such that the tuning signal can be monitored by phase detector loop controller 210 as necessary. In this example, oscillator output node 230 is also coupled to an end of resistance element 214. Thus, resistance element 214 is connected between oscillator output node 230 and filter output node 222 when resonator filter circuit 200 is in the tuning mode. The value of resistance element 214 (which is not critical to the performance of resonator filter circuit 200) is selected to provide a detectable phase shifting characteristic.

Phase detector loop controller 210 also includes a second input 234 that is coupled to filter output node 222. In accordance with known techniques, phase detector loop controller 210 is configured to measure a phase difference between the signals present on first input 232 and second input 234, and to generate control signal 228 in response to that phase difference. In the example embodiment described herein, phase detector loop controller 210 is coupled between oscillator output node 230 and filter output node 222, is suitably configured to measure the phase difference across resistance element 214, and is suitably configured to adjust tunable resonator 206 in response to the phase difference when resonator filter circuit 200 is in the tuning mode. In this example, control signal 228 adjusts variable capacitance element 226 in response to the measured phase difference.

When resonator filter circuit 200 is in the tuning mode, switch 212 is set to the tuning state. When in the tuning state, switch 212 connects resistance element 214 to filter output node 222 and disconnects circuit input node 202 from filter output node 222. In this manner, switch 212 isolates tunable resonator 206 from any outside sources or influences that might otherwise be coupled through circuit input node 202. When resonator filter circuit 200 is in the run mode, switch 212 is set to the run state. When in the run state, switch 212 disconnects resistance element 214 from filter output node 222 and connects circuit input node 202 to filter output node 222.

Figure 3:
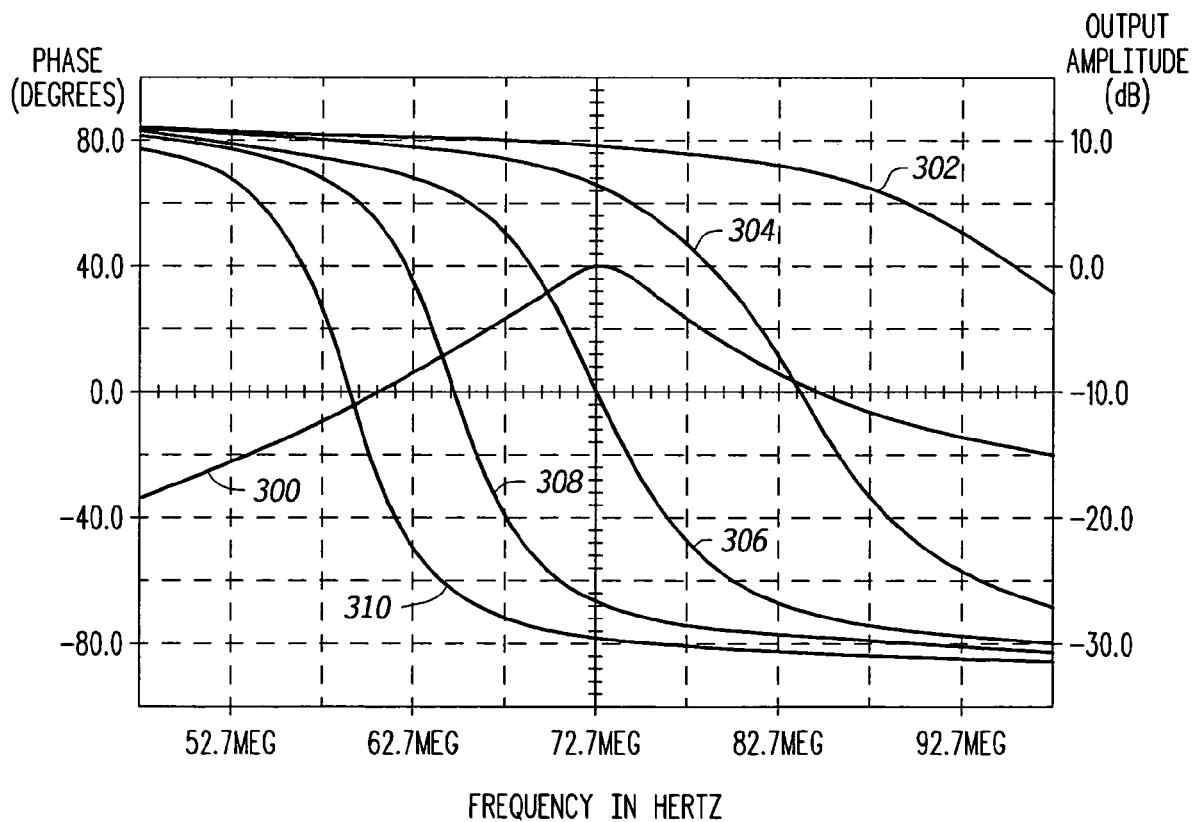
FIG. 3 is a graph that illustrates the tuning characteristics of a resonator filter circuit configured in accordance with an example embodiment of the invention.

The tuning methodology for resonator filter circuit 200 will now be described with reference to FIG. 3, which is a graph that illustrates the tuning characteristics of a resonator filter circuit configured in accordance with an example embodiment of the invention. In FIG. 3, the plot 300 represents the amplitude response for the resonator filter circuit; plot 300 uses the right vertical scale of FIG. 3. Plot 300 illustrates how the amplitude response peaks at 72.7 MHz (the desired resonant frequency) for this example. The remaining plots, which use the left vertical scale of FIG. 3, represent the phase measured across the resistance element (for example, resistance element 214 in FIG. 2) for different values of the variable capacitance element (for example, capacitance element 226 in FIG. 2). Plot 306 represents the phase measurement over the frequency range for a capacitance value of 20 pF. Plot 306 illustrates that peak amplitude coincides with a zero degree phase shift across the resistance element at 72.7 MHz. Notably, plot 306 also illustrates that the phase difference is negative if the frequency is higher than 72.7 MHz and positive if the frequency is lower than 72.7 MHz. Consequently, this provides a deterministic technique for adjusting the center frequency of the resonator filter circuit via the magnitude and sign of the measured phase difference.

Plot 302 represents the phase measurement for a capacitance value of 10 pF, plot 304 represents the phase measurement for a capacitance value of 15 pF, plot 308 represents the phase measurement for a capacitance value of 25 pF, and plot 310 represents the phase measurement for a capacitance value of 30 pF. These additional plots illustrate how different capacitance values result in nonzero phase at 72.7 MHz. As shown, positive phase at the desired center frequency indicates that the capacitance value is too low, while negative phase at the desired center frequency indicates that the capacitance value is too high. This provides a deterministic technique for tuning the resonator filter circuit via the magnitude and sign of the measured phase difference. In practice, the amplitude response alone (plot 300) is not utilized to align the resonator filter circuit because the maximum amplitude value can vary for different operating conditions and for different portions of the band being tuned. The zero phase value, however, remains centered over different operating conditions and portions of the tuned band.

As described above, when resonator filter circuit 200 is in the tuning mode, oscillator 208 is set to generate a tuning signal at a reference frequency, which corresponds to the desired resonant frequency for tunable resonator 206. In a practical television tuner application, oscillator 208 is configured to generate frequencies within the range of approximately 50-800 MHz. Phase detector loop controller 210 measures the phase difference across resistance element 214 and analyzes the phase difference to determine how to regulate control signal 228. For example, if the phase difference is positive, then phase detector loop controller 210 will adjust control signal 228 such that the value of variable capacitance element 226 is increased. In contrast, if the phase difference is negative, then phase detector loop controller 210 will adjust control signal 228 such that the value of variable capacitance element 226 is decreased. In this regard, phase detector loop controller 210 is configured to adjust tunable resonator 206 such that the phase difference is driven toward zero degrees. This adjustment of tunable resonator 206 causes it to resonate at the desired resonant frequency (or at a frequency that is within a practical threshold amount of the desired resonant frequency).

After tunable resonator 206 has been aligned, the tuning parameters for that center frequency are saved so that they can be retrieved when needed. Alternatively, if tunable resonator 206 is dynamically tuned with each channel selection, then the current tuning parameters may be maintained after switch 212 is placed into the run state. When operating in the run mode, resonator filter circuit 200 preserves the tuning parameters such that the value of variable capacitance element 226 is maintained.

In a practical embodiment, the operation of resonator filter circuit 200 may be influenced, governed, and/or controlled by suitable switching control logic, memory, and possibly other components (not shown in FIG. 2). For example, switch 212 may be an RF switch that is controlled with appropriate digital logic, and the tuning parameters for tunable resonator 206 may be stored in (and retrieved from) one or more memory elements. Such additional components may include any number of on-chip and/or off-chip elements, depending upon the practical implementation of resonator filter circuit 200.

Figure 4:
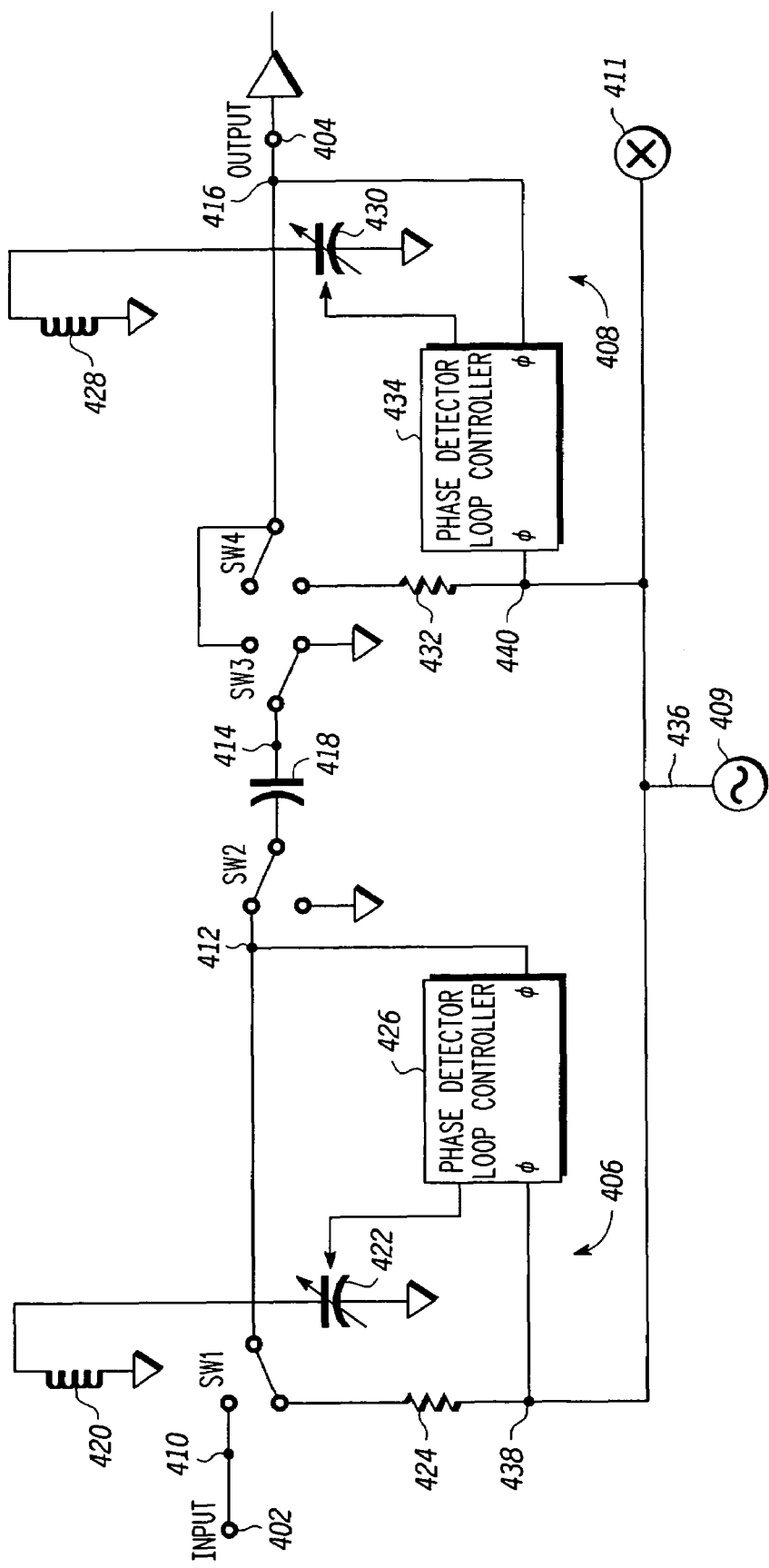
FIG. 4 is a schematic circuit diagram of a coupled resonator filter circuit configured in accordance with an example embodiment of the invention, depicted in a first tuning mode.
Figure 5:
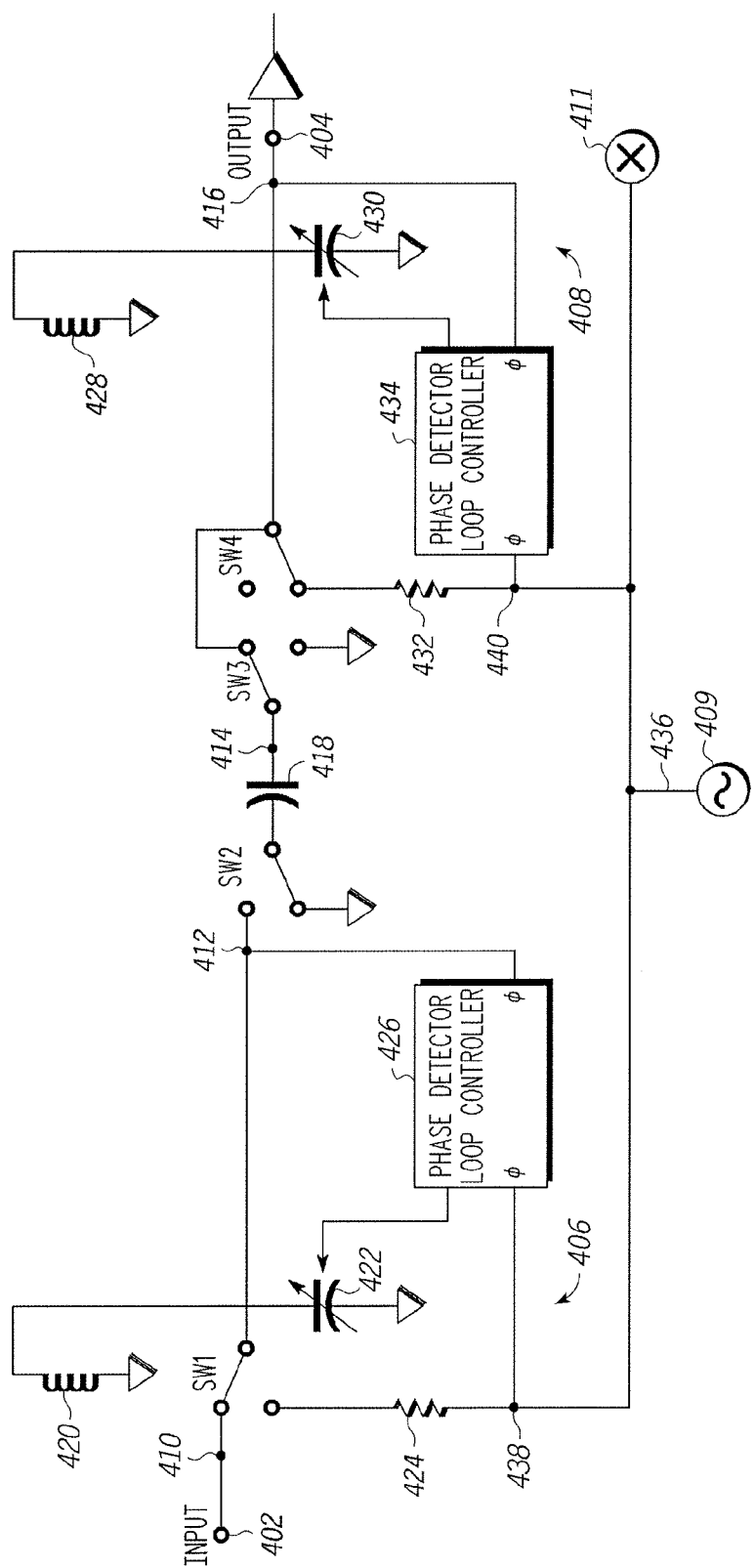
FIG. 5 is a schematic circuit diagram of the coupled resonator filter circuit shown in FIG. 4, depicted in a second tuning mode.
Figure 6:
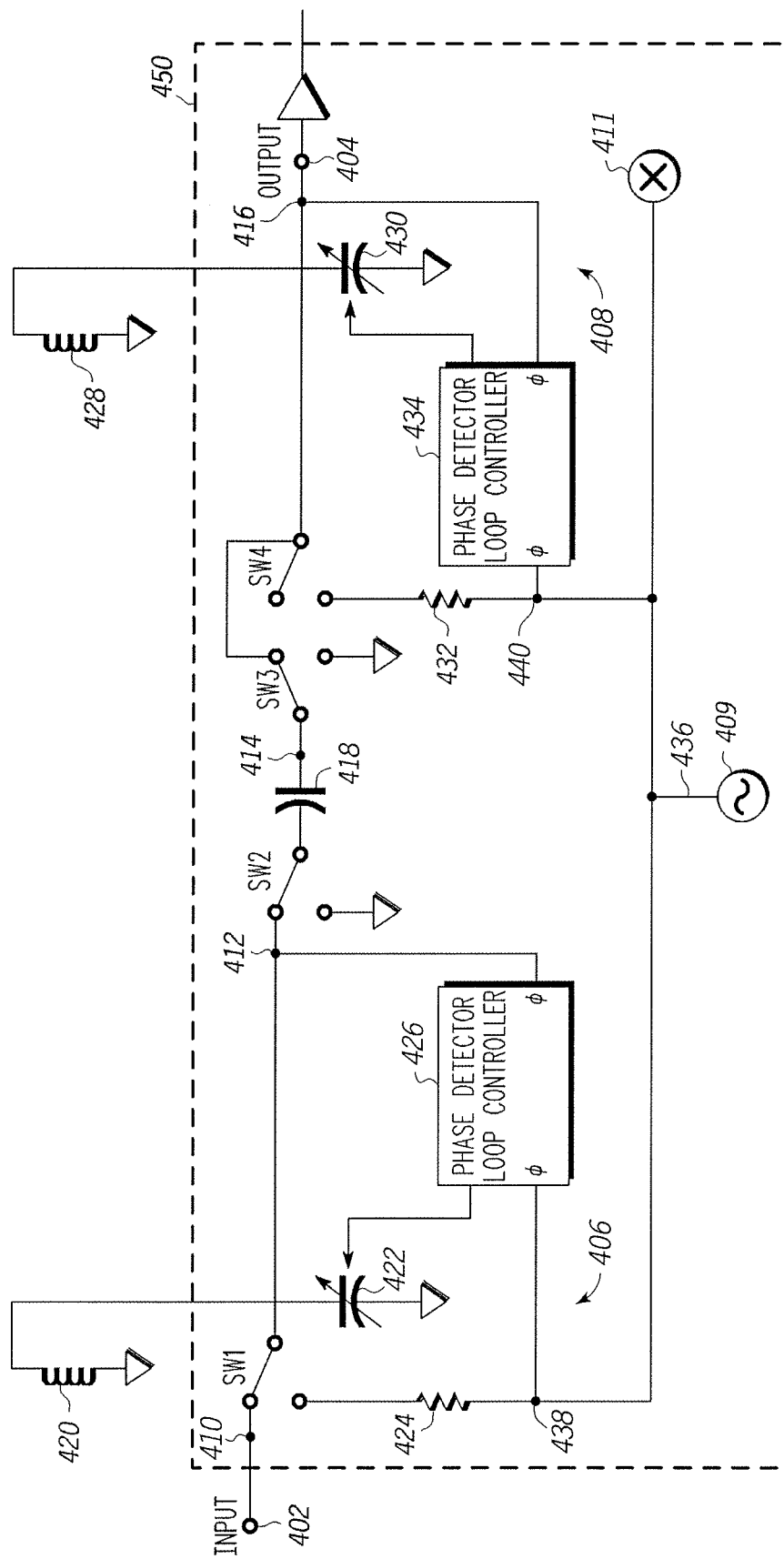
FIG. 6 is a schematic circuit diagram of the coupled resonator filter circuit shown in FIG. 4, depicted in a run mode.

A plurality of resonator filter circuits as described above can be combined using a switching architecture to form a coupled resonator filter circuit. In this regard, FIG. 4 is a schematic circuit diagram of a self-aligned coupled resonator filter circuit 400 configured in accordance with an example embodiment of the invention, depicted in a first tuning mode, FIG. 5 is a schematic circuit diagram of coupled resonator filter circuit 400 depicted in a second tuning mode, and FIG. 6 is a schematic circuit diagram of coupled resonator filter circuit 400 depicted in a run mode. Although coupled resonator filter circuit 400 includes only two resonator filter stages, a practical embodiment may include any number of coupled resonator filter stages. Coupled resonator filter circuit 400 shares a number of features, elements, and aspects with resonator filter circuit 200 and such common features, elements, and aspects will not be redundantly described herein.

Coupled resonator filter circuit 400 generally includes a circuit input node 402, a circuit output node 404, a first tunable resonator stage 406, a second tunable resonator stage 408, a switching architecture (which includes switches labeled SW1, SW2, SW3, and SW4 in this example), and an oscillator 409. FIGS. 4-6 also depict a mixer 411 to illustrate the dual use of oscillator 409, namely, as a signal source for the alignment circuitry and as the local oscillator for the receiver function in the run mode. Circuit input node 402 receives an input signal and circuit output node 404 provides a filtered output signal that is based upon the input signal. First tunable resonator stage 406 includes a first filter input node 410 (which corresponds to circuit input node 402 in this example) and a first filter output node 412. Likewise, second tunable resonator stage 408 includes a second filter input node 414 and a second filter output node 416 (which corresponds to circuit output node 404 in this example). Notably, second filter input node 414 may be coupled to first filter output node 412 via the SW2 switch and a coupling capacitance element 418. In practice, coupling capacitance element 418 is a relatively small capacitance that is fixed for each channel. For example, coupling capacitance element 418 may be approximately 1% to 5% of the value of the tuned capacitor in a practical embodiment. Generally, each tunable resonator stage 406/408 is configured to operate substantially as described above in connection with self-aligning resonator filter circuit 200.

First tunable resonator stage 406 generally includes a first tunable resonator (comprising a first inductance element 420 in parallel with a first variable capacitance element 422), a first resistance element 424, and a first phase detector loop controller 426. The first tunable resonator is coupled to first filter output node 412, and the remaining components of first tunable resonator stage 406 are coupled to each other in the manner described above for resonator filter circuit 200. Second tunable resonator stage 408 generally includes a second tunable resonator (comprising a second inductance element 428 in parallel with a second variable capacitance element 430), a second resistance element 432, and a second phase detector loop controller 434. The second tunable resonator is coupled to second filter output node 416, and the remaining components of second tunable resonator stage 408 are coupled to each other in the manner described above for resonator filter circuit 200.

In a practical embodiment, variable capacitance elements 422/430 can have a tunable range of approximately 2-30 pF. Although not shown, tunable resonator stages 406/408 may share a common phase detector loop controller.

Oscillator 409, which may be the local oscillator utilized by the tuner or receiver that incorporates coupled resonator filter circuit 400, has an oscillator output node 436. Oscillator 409 is suitably configured and controlled to generate a tuning signal at oscillator output node 436, where the tuning signal is generated at a reference frequency when resonator filter circuit 400 is in a tuning mode. Oscillator output node 436 may be coupled to a first reference input node 438 of the first tunable resonator stage and to a second reference input node 440 of the second tunable resonator stage. In this example, oscillator output node 436 is also coupled to an end of first resistance element 424, to an end of second resistance element 432, and to the oscillator input node of mixer 411.

The switching architecture utilized by coupled resonator filter circuit 400 is suitably configured to isolate first tunable resonator stage 406 from second tunable resonator stage 408 for closed loop tuning of first tunable resonator stage 406 when coupled resonator filter circuit 400 is in a first tuning mode (depicted in FIG. 4). The switching architecture is also suitably configured to facilitate tuning of second tunable resonator stage 408 when coupled resonator filter circuit 400 is in a second tuning mode. In this example, the switching architecture is configured to isolate second tunable resonator stage 408 from first tunable resonator stage 406 for closed loop tuning of second tunable resonator stage 408 when coupled resonator filter circuit 400 is in a second tuning mode (depicted in FIG. 5). As mentioned above, the switching architecture includes at least the SW1, SW2, SW3, and SW4 switches, each of which is controllable to switch between a run state corresponding to the run mode and either a first tuning state corresponding to the first tuning mode or a second tuning state corresponding to the second tuning mode.

The SW1 switch has one input coupled to circuit input node 402, one input coupled to first resistance element 424, and a common output coupled to first filter output node 412. FIG. 4 depicts the SW1 switch in the first tuning state, and FIG. 6 depicts the SW1 switch in the run state. When coupled resonator filter circuit 400 is in the second tuning mode the SW1 switch can be in either position. The SW2 switch has one input coupled to first filter output node 412, one input coupled to ground, and a common output coupled to the input side of coupling capacitor element 418. FIG. 4 depicts the SW2 switch in the first tuning state, FIG. 5 depicts the SW2 switch in the second tuning state, and FIG. 6 depicts the SW2 switch in the run state. The SW3 switch has one output coupled to ground, one output coupled to second filter output node 416, and a common input coupled to second filter input node 414. FIG. 4 depicts the SW3 switch in the first tuning state, FIG. 5 depicts the SW3 switch in the second tuning state, and FIG. 6 depicts the SW3 switch in the run state. The SW4 switch has one floating input, one input coupled to second resistance element 432, and a common output coupled to second filter output node 416. FIG. 5 depicts the SW4 switch in the second tuning state, and FIG. 6 depicts the SW4 switch in the run state. When coupled resonator filter circuit 400 is in the first tuning mode the SW4 switch can be in either position.

Referring to FIG. 4, for the first tuning mode the switching architecture (namely, the SW1 switch) disconnects circuit input node 402 from first tunable resonator stage 406, disconnects circuit input node 402 from first filter output node 412, and connects first resistance element 424 to first filter output node 412. In addition, the switching architecture (namely, the SW2 switch and the SW3 switch) connects coupling capacitance element 418 in parallel with the first tunable resonator. In other words, first inductance element 420, first variable capacitance 422, and coupling capacitance element 418 are all connected between first filter output node 412 and ground when resonator filter circuit 400 is in the first tuning mode. Furthermore, the switching architecture (namely, the SW3 switch) disconnects first tunable resonator stage 406 from second tunable resonator stage 408, providing isolation for closed loop tuning of first tunable resonator stage 406 such that the presence of second tunable resonator stage 408 does not influence the tuning of first tunable resonator stage 406.

The tuning of first tunable resonator stage 406 is performed as described above for resonator filter circuit 200, however, coupling capacitance element 418 is included in the first tunable resonator and the adjustment of variable capacitance element 422 will reflect the inclusion of coupling capacitance element 418. Briefly, first resistance element 424 is connected between first reference input node 438 and first filter output node 412, which allows first phase detector loop controller 426 to measure the phase difference across first resistance element 424. As described above, first phase detector loop controller 426 adjusts the first tunable resonator (e.g., variable capacitance element 422) in response to the measured phase difference to drive the phase difference toward zero degrees.

Referring to FIG. 5, for the second tuning mode the switching architecture (namely, the SW1 switch) connects circuit input node 402 to first tunable resonator stage 406, connects circuit input node 402 to first filter output node 412, and disconnects first resistance element 424 from first filter output node 412. Although in the second tuning mode the SW1 switch can be in either position, if the SW1 switch is in the position shown in FIG. 5, it is already in the correct state for the run mode shown in FIG. 6. In addition, the switching architecture (namely, the SW2 switch and the SW3 switch) connects coupling capacitance element 418 in parallel with the second tunable resonator. In other words, second inductance element 428, second variable capacitance 430, and coupling capacitance element 418 are all connected between second filter output node 416 and ground when resonator filter circuit 400 is in the second tuning mode. Notably, coupling capacitor element 418 contributes to the determination of the tuning parameters for both the first and second tunable resonator stages. Furthermore, the switching architecture (namely, the SW2 switch) disconnects first tunable resonator stage 406 from second tunable resonator stage 408, providing isolation for closed loop tuning of second tunable resonator stage 408 such that the presence of first tunable resonator stage 406 does not influence the tuning of second tunable resonator stage 408. Finally, the switching architecture (namely, the SW4 switch) connects second resistance element 432 to second filter output node 416.

The tuning of second tunable resonator stage 408 is performed as described above for resonator filter circuit 200, however, coupling capacitance element 418 is included in the second tunable resonator and the adjustment of variable capacitance element 430 will reflect the inclusion of coupling capacitance element 418. Briefly, second resistance element 432 is connected between second reference input node 440 and second filter output node 416, which allows second phase detector loop controller 434 to measure the phase difference across second resistance element 432. As described above, second phase detector loop controller 434 adjusts the second tunable resonator (e.g., variable capacitance element 430) in response to the measured phase difference to drive the phase difference toward zero degrees.

The tuning of first and second resonator stages 406/408 can be performed for each desired channel frequency to obtain tuning parameters and settings for each channel. The tuning parameters and settings may be saved in a suitable memory element (not shown) for retrieval when a particular channel is selected. Alternatively, first and second resonator stages 406/408 can be tuned in real time in response to the selection of a particular channel.

Alternate embodiments of resonator filter circuit 400 need not isolate first tunable resonator stage 406 from second tunable resonator stage 408 during tuning of second tunable resonator stage 408. Rather, once first tunable resonator stage 406 is tuned, it can serve as a test signal source for second tunable resonator stage 408, and second tunable resonator stage 408 can be tuned in a manner equivalent to that described above. If a resonator filter circuit includes three or more stages, each subsequent tunable resonator stage can be similarly tuned after the preceding stages have been tuned. In other words, each subsequent tunable resonator stage can be tuned based upon a test signal obtained from a combination of the preceding stages.

Referring to FIG. 6, for the run mode the switching architecture (namely, the SW1 switch) connects circuit input node 402 to first tunable resonator stage 406, connects circuit input node 402 to first filter output node 412, and disconnects first resistance element 424 from first filter output node 412. In addition, the switching architecture (namely, the SW2 switch and the SW3 switch) connects coupling capacitance element 418 between first filter output node 412 and second filter input node 414. In other words, coupling capacitance element 418 serves to couple the two tunable resonator stages together. Furthermore, the switching architecture (namely, the SW3 switch) connects coupling capacitance element 418 to second filter output node 416, and the switching architecture (namely, the SW4 switch) disconnects second resistance element 432 from second filter output node 416. In the run mode, oscillator 409 is set to the desired reference frequency (in a practical television tuner application, oscillator 409 is adjusted in accordance with the selected viewing channel). In addition, the appropriate tuning parameters for first and second resonator stages 406/408 are provided to enable coupled resonator filter circuit 400 to filter the correct frequencies.

In practice, coupled resonator filter circuit 400 can be realized on an IC 450 (depicted as a dashed line in FIG. 6, but not shown in FIGS. 4 and 5). As depicted in FIG. 6, first inductance element 420 and second inductance element 428 may be realized as off-chip components due to their physical size, and all other components of coupled resonator filter circuit 400 can be realized as on-chip components. Thus, resonator filter circuit 400 can be fabricated with four input/output ports: one for the circuit input, one for the circuit output, one for first inductance element 420, and one for second inductance element 428.

Figure 7:
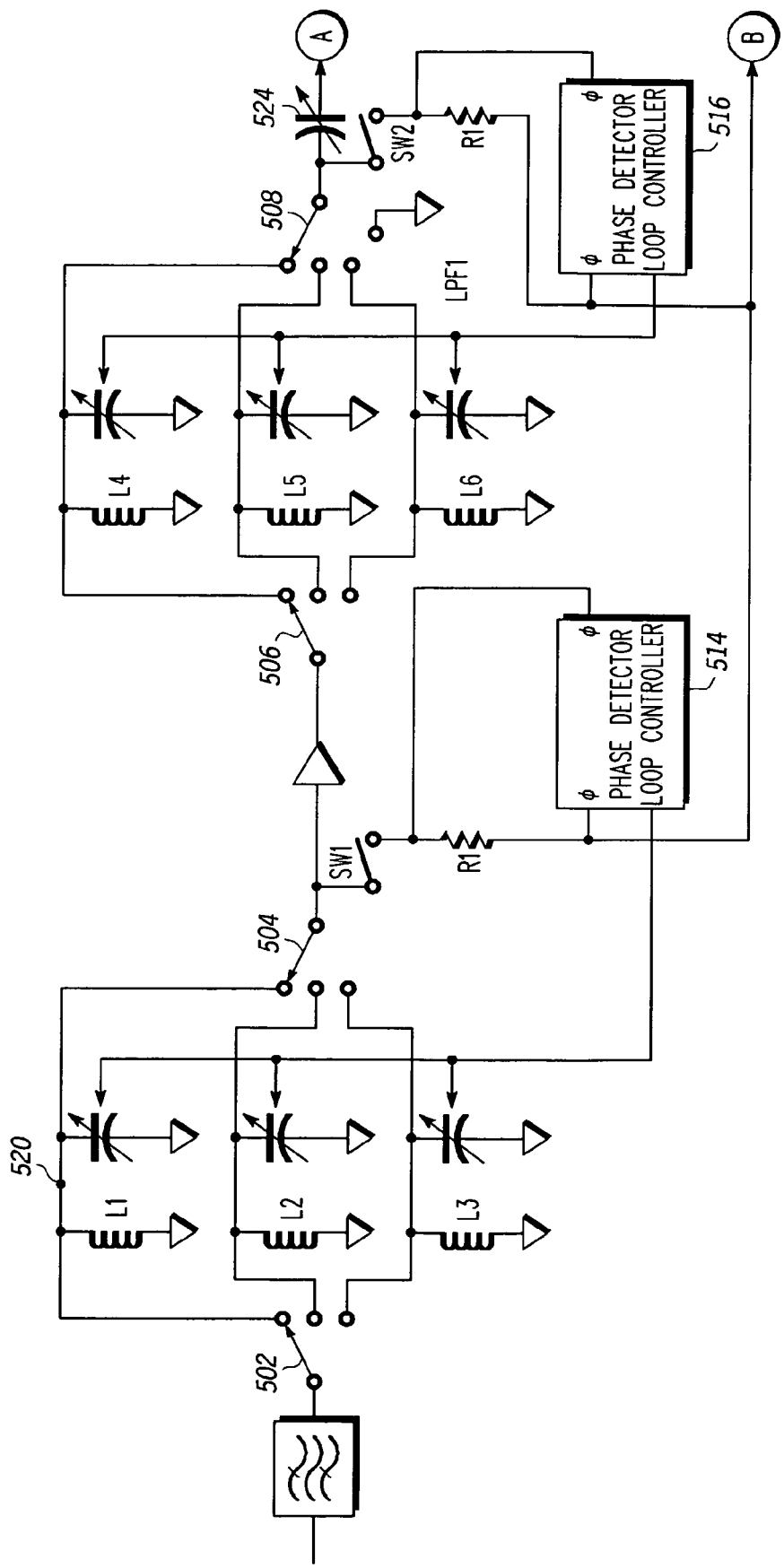
FIG. 7 is a first portion of a schematic circuit diagram of a television tuner circuit configured in accordance with an example embodiment of the invention.
Figure 8:
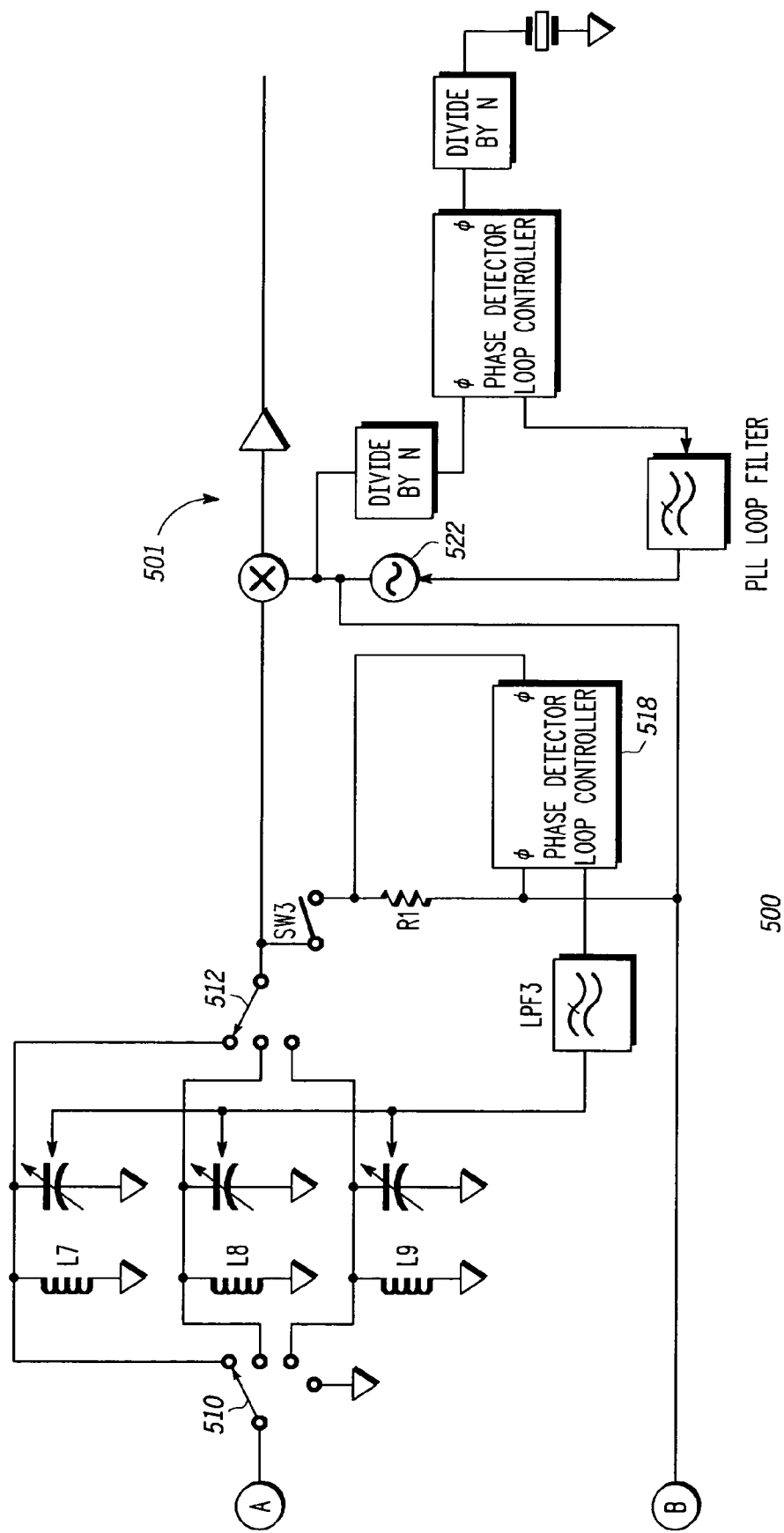
FIG. 8 is a second portion of the schematic circuit diagram shown in FIG. 7.

The self-aligning tunable resonator filter circuits described above may be utilized in a practical television tuner circuit. In this regard, FIGS. 7 and 8 in combination are a schematic circuit diagram of a television tuner circuit 500 configured in accordance with an example embodiment of the invention. The general topology of television tuner circuit 500 is similar to the prior art single conversion tuner topology shown in FIG. 1. Television tuner circuit 500 generally includes a tunable resonator filter section coupled to a MOP section 501. The tunable resonator filter section includes a UHF branch (the upper branch that includes inductance elements L1, L4, L7, and the corresponding parallel connected variable capacitance elements), a VHFH branch (the middle branch that includes inductance elements L2, L5, L8, and the corresponding parallel connected variable capacitance elements), and a VHFL branch (the lower branch that includes inductance elements L3, L6, L9, and the corresponding parallel connected variable capacitance elements). Each branch includes three tunable resonator filters that are adjusted in accordance with the selected viewing channel. Television tuner circuit 500 selects one of the three branches via switches 502, 504, 506, 508, 510, and 512, each of which is controlled in response to the selected viewing channel. FIGS. 7 and 8 depict a switching state where the UHF branch has been selected for operation in the run mode.

In this example, the first tunable resonator stage for any given branch is tuned with a phase detector loop controller 514, the second tunable resonator stage for any given branch is tuned with a phase detector loop controller 516, and the third tunable resonator stage for any given branch is tuned with a phase detector loop controller 518. These phase detector loop controllers are suitably configured to perform the self-alignment techniques described above. Switches 502, 504, 506, 508, 510, and 512, and switches SW1, SW2, and SW3, are controlled to enable the isolated tuning of the coupled resonator filter circuits in each branch. For example, when aligning the first tunable resonator stage in the UHF branch, switch 502 is set such that its pole is floating, switch 504 is set as shown in FIG. 7, the SW1 switch is set to connect the R1 resistance element to the node 520, and switch 506 is set such that its pole is floating. In practice, the input is left floating when the input filter output impedance is non-reactive at the frequency of interest. Otherwise, the input is left connected to compensate for any reactance in the input filter and the switching is done prior to the input filter. This configuration isolates this tunable resonator stage from components that would otherwise be connected to its input and output. An oscillator 522 generates the tuning signal at the desired reference frequency for tuning.

The second and third tunable resonator stages in each branch are coupled together in a manner that is equivalent to that described above for coupled resonator filter circuit 400. Accordingly, the switches in television tuner circuit 500 are suitably controlled to isolate the respective tunable resonator stages as necessary to connect a coupling capacitance element 524 in parallel with the respective tunable resonators, and to connect coupling capacitance element 524 between the tunable resonator stages when television tuner circuit 500 is in the run mode.

Although not shown in the figures, a self-aligning resonator filter circuit as described above can also be incorporated into an otherwise conventional double conversion tuner circuit arrangement to replace the IF SAW filter, which is typically an expensive off-chip component. In such an implementation, the self-aligning resonator filter circuit provides an inexpensive and easy-to-implement alternative to the SAW filter.

The techniques and circuits described above can be implemented in a wideband receiver such as a tuner circuit incorporated in a television set, a VCR, a cable television set top box, a personal computer tuner card, or the like. The techniques and circuits described above may also be implemented in other wireless receiver devices such as cellular telephones. The self-aligning resonator filter circuit operates at lower power and can be manufactured at lower cost than conventional circuits that utilize manual tuning techniques and more off-chip components. In practice, the circuits described herein bring high performance and low assembly cost to single conversion tuners and are capable of eliminating the high cost SAW filters of double conversion tuners. In addition, the resonator filter circuits are relatively straightforward to realize because integrated RF switching, PLL circuits, and control state machines are all common elements in conventional chip-based tuners.

In summary, systems, devices, and methods configured in accordance with example embodiments of the invention relate to:

A self-aligning resonator filter circuit comprising a tunable resonator having a filter output node, an oscillator having an oscillator output node, the oscillator being configured to generate a tuning signal at the oscillator output node, a resistance element between the oscillator output node and the filter output node when the self-aligning resonator filter circuit is in a tuning mode, and a phase detector loop controller coupled between the oscillator output node and the filter output node, the phase detector loop controller being configured to measure a phase difference across the resistance element, and to adjust the tunable resonator in response to the phase difference. The self-aligning resonator filter circuit may further comprise a circuit input node and a switch coupled to the circuit input node, the resistance element, and the filter output node, the switch being controllable to switch between a run state corresponding to a run mode for the self-aligning resonator filter circuit and a tuning state corresponding to the tuning mode, where the switch is configured to disconnect the resistance element from the filter output node when the self-aligning resonator filter circuit is in the run mode, and to connect said resistance element to said filter output node when the self-aligning resonator-filter circuit is in the tuning mode. The switch may be configured to connect the circuit input node to the filter output node when the self-aligning resonator filter circuit is in the run mode, and to disconnect the circuit input node from the filter output node when the self-aligning resonator filter circuit is in the tuning mode. The tunable resonator may comprise an inductance element in parallel with a variable capacitance element, where the phase detector loop controller is configured to adjust the variable capacitance element in response to the phase difference. The local oscillator, the resistance element, the phase detector loop controller, and the variable capacitance element can be on-chip components, and the inductance element can be an off-chip component. The phase detector loop controller may be configured to adjust the tunable resonator such that the phase difference is driven toward zero degrees. The oscillator may be configured to generate the tuning signal at a reference frequency, and the phase detector loop controller may be configured to adjust the tunable resonator such that it resonates at the reference frequency. The tuning mode can be performed at each power-up cycle of a system that includes the self-aligning resonator filter circuit, and/or each time a tuner channel is selected for the self-aligning resonator filter circuit.

A self-aligning coupled resonator filter circuit comprising a first tunable resonator stage having a first filter output node, a second tunable resonator stage having a second filter input node coupled to the first filter output node, and a switching architecture configured to isolate the first tunable resonator stage from the second tunable resonator stage for closed loop tuning of the first tunable resonator stage when the self-aligning coupled resonator filter circuit is in a first tuning mode, and to facilitate tuning of the second tunable resonator stage when the self-aligning coupled resonator filter circuit is in a second tuning mode. The switching architecture may be configured to isolate the second tunable resonator stage from the first tunable resonator stage for closed loop tuning of the second tunable resonator stage when the self-aligning coupled resonator filter circuit is in a second tuning mode. The self-aligning coupled resonator filter circuit may further comprise a circuit input node, where the switching architecture is configured to connect the circuit input node to the first tunable resonator stage when the self-aligning coupled resonator filter circuit is in the run mode, and to disconnect the circuit input node from the first tunable resonator stage when the self-aligning coupled resonator filter circuit is in the first tuning mode. The switching architecture may be configured to connect a coupling capacitance element between the first filter output node and the second filter input node when the self-aligning coupled resonator filter circuit is in the run mode. The first tunable resonator stage may comprise a first tunable resonator, and the switching architecture may be configured to connect the coupling capacitance element in parallel with the first tunable resonator when the self-aligning coupled resonator filter circuit is in the first tuning mode. The second tunable resonator stage may comprise a second tunable resonator, and the switching architecture may be configured to connect the coupling capacitance element in parallel with the second tunable resonator when the self-aligning coupled resonator filter circuit is in the second tuning mode. The self-aligning coupled resonator filter circuit may further comprise an oscillator having an oscillator output node, the oscillator being configured to generate a tuning signal at the oscillator output node, wherein the first tunable resonator stage includes a first reference input node coupled to the oscillator output node, and the second tunable resonator stage includes a second reference input node coupled to the oscillator output node. The first tunable resonator stage may comprise a first tunable resonator coupled to the first filter output node, a first resistance element connected between the first reference input node and the first filter output node when the self-aligning coupled resonator filter circuit is in the first tuning mode, and a first phase detector loop controller coupled between the first reference input node and the first filter output node, the first phase detector loop controller being configured to measure a first phase difference across the first resistance element, and to adjust the first tunable resonator in response to the first phase difference. The first tunable resonator may comprise a first inductance element in parallel with a first variable capacitance element, where the first phase detector loop controller is configured to adjust the first variable capacitance element in response to the first phase difference. The first phase detector loop controller can be configured to adjust the first tunable resonator such that the first phase difference is driven toward zero degrees. The self-aligning coupled resonator filter circuit may further comprise a circuit input node, and the switching architecture may comprise a first switch coupled to the circuit input node, the first resistance element, and the first filter output node, the first switch being controllable to switch between a run state corresponding to a run mode for the self-aligning coupled resonator filter circuit and a first tuning state corresponding to the first tuning mode, where the first switch is configured to disconnect the first resistance element from the first filter output node when the self-aligning coupled resonator filter circuit is in the run mode, and to connect the first resistance element to the first filter output node when the self aligning coupled resonator circuit is in the first tuning mode. The second tunable resonator stage may comprise a second tunable resonator coupled to the second filter output node, a second resistance element connected between the second reference input node and the second filter output node when the self-aligning coupled resonator filter circuit is in the second tuning mode, and a second phase detector loop controller coupled between the second reference input node and the second filter output node, the second phase detector loop controller being configured to measure a second phase difference across the second resistance element, and to adjust the second tunable resonator in response to the second phase difference. The second tunable resonator may comprise a second inductance element in parallel with a second variable capacitance element, and the second phase detector loop controller may be configured to adjust the second variable capacitance element in response to the second phase difference. The second phase detector loop controller may be configured to adjust the second tunable resonator such that the second phase difference is driven toward zero degrees. The switching architecture may comprise a second switch coupled to the second resistance element and the second filter output node, the second switch being controllable to switch between the run state and a second tuning state corresponding to the second tuning mode, the second switch being configured to disconnect the second resistance element from the second filter output node when the self-aligning coupled resonator filter circuit is in the run mode, and to connect the second resistance element to the second filter output node when the self-aligning coupled resonator filter circuit is in the second tuning mode.

A method for tuning a self-aligning coupled resonator circuit comprising a first tunable resonator, a second tunable resonator, a coupling capacitor coupled between an output of the first tunable resonator and an input of the second tunable resonator, and a switching architecture coupled between an output of the first tunable resonator and an input of the second tunable resonator, the method comprising setting the switching architecture to a first tuning state that connects the coupling capacitor in parallel with the first tunable resonator and isolates the first tunable resonator from the second tunable resonator for closed loop tuning of the first tunable resonator when the self-aligning coupled resonator filter circuit is in a first tuning mode, and setting the switching architecture to a second tuning state that connects the coupling capacitor in parallel with the second tunable resonator and isolates the second tunable resonator from the first tunable resonator for closed loop tuning of the second tunable resonator when the self-aligning coupled resonator filter circuit is in a second tuning mode. The method may further comprise setting the switching architecture to a run state that connects the output of the first tunable resonator to the input of the second tunable resonator via the coupling capacitor. The self-aligning coupled resonator circuit may further comprise a circuit input node, where setting the switching architecture to the run state connects an input of the first resonator to the circuit input node. The self-aligning coupled resonator circuit may further comprise a circuit input node, where setting the switching architecture to the first tuning state disconnects an input of the first tunable resonator from the circuit input node.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A self-aligning coupled resonator filter circuit comprising:
   a first tunable resonator stage having a first filter output node;
   second tunable resonator stage having a second filter input node coupled to said first filter output node; and
   a switching architecture configured to isolate said first tunable resonator stage from said second tunable resonator stage for closed loop tuning of said first tunable resonator stage when the self-aligning coupled resonator filter circuit is in a first tuning mode, such that presence of said second tunable resonator stage does not influence tuning of said first tunable resonator stage, and to facilitate closed loop tuning of said second tunable resonator stage when the self-aligning coupled resonator filter circuit is in a second tuning mode, such that presence of said first tunable resonator stage does not influence tuning of said second tunable resonator stage.

2. A self-aligning coupled resonator filter circuit according to claim 1, said switching architecture being configured to connect a coupling capacitance element between said first filter output node and said second filter input node when the self aligning coupled resonator filter circuit is in said run mode.

3. A self-aligning coupled resonator filter circuit according to claim 2, said first tunable resonator stage comprising a first tunable resonator, and said switching architecture being configured to connect said coupling capacitance element in parallel with said first tunable resonator when the self-aligning coupled resonator filter circuit is in said first tuning mode.

4. A self-aligning coupled resonator filter circuit according to claim 2, said second tunable resonator stage comprising a second tunable resonator, and said switching architecture being configured to connect said coupling capacitance element in parallel with said second tunable resonator when the self-aligning coupled resonator filter circuit is in said second tuning mode.

5. A self-aligning coupled resonator filter circuit according to claim 1, further comprising an oscillator having an oscillator output node, said oscillator being configured to generate a tuning signal at said oscillator output node, wherein said first tunable resonator stage includes a first reference input node coupled to said oscillator output node, and said second tunable resonator stage includes a second reference input node coupled to said oscillator output node.

6. A self-aligning coupled resonator filter circuit comprising:
   a first tunable resonator stage having a first filter output node;
   a second tunable resonator stage having a second filter input node coupled to said first filter output node;
   a switching architecture configured to isolate said first tunable resonator stage from said second tunable resonator stage for closed loop tuning of said first tunable resonator stage when the self-aligning coupled resonator filter circuit is in a first tuning mode, and to facilitate tuning of said second tunable resonator stage when the self-aligning coupled resonator filter circuit is in a second tuning mode; and
   an oscillator having an oscillator output node, said oscillator being configured to generate a tuning signal at said oscillator output node, wherein said first tunable resonator stage includes a first reference input node coupled to said oscillator output node, and said second tunable resonator stage includes a second reference input node coupled to said oscillator output node; wherein
   said first tunable resonator stage comprises:
      a first tunable resonator coupled to said first filter output node;
      a first resistance element connected between said first reference input node and said first filter output node when the self-aligning coupled resonator filter circuit is in said first tuning mode; and
      a first phase detector loop controller coupled between said first reference input node and said first filter output node, said first phase detector loop controller being configured to measure a first phase difference across said first resistance element, and to adjust said first tunable resonator in response to said first phase difference.

7. A self-aligning coupled resonator filter circuit according to claim 6, further comprising a circuit input node, and said switching architecture comprising:
   a first switch coupled to said circuit input node, said first resistance element, and said first filter output node, said first switch being controllable to switch between a run state corresponding to a run mode for the self-aligning coupled resonator filter circuit and a first tuning state corresponding to said first tuning mode;
   said first switch being configured to disconnect said first resistance element from said first filter output node when the self-aligning coupled resonator filter circuit is in said run mode, and to connect said first resistance element to said first filter output node when the self aligning coupled resonator circuit is in said first tuning mode.

8. A self-aligning coupled resonator filter circuit according to claim 6, said second tunable resonator stage comprising:
   a second tunable resonator coupled to said second filter output node;
   a second resistance element connected between said second reference input node and said second filter output node when the self-aligning coupled resonator filter circuit is in said second tuning mode; and
   a second phase detector loop controller coupled between said second reference input node and said second filter output node, said second phase detector loop controller being configured to measure a second phase difference across said second resistance element, and to adjust said second tunable resonator in response to said second phase difference.

9. A self-aligning coupled resonator filter circuit according to claim 8, said switching architecture comprising:
   a second switch coupled to said second resistance element and said second filter output node, said second switch being controllable to switch between said run state and a second tuning state corresponding to said second tuning mode;
   said second switch being configured to disconnect said second resistance element from said second filter output node when the self-aligning coupled resonator filter circuit is in said run mode, and to connect said second resistance element to said second filter output node when the self-aligning coupled resonator filter circuit is in said second tuning mode.

10. A method for tuning a self-aligning coupled resonator circuit comprising a first tunable resonator, a second tunable resonator, a coupling capacitor coupled between an output of the first tunable resonator and an input of the second tunable resonator, and a switching architecture coupled between an output of the first tunable resonator and an input of the second tunable resonator, said method comprising:
   setting the switching architecture to a first tuning state that connects the coupling capacitor in parallel with the first tunable resonator and isolates the first tunable resonator from the second tunable resonator for closed loop tuning of the first tunable resonator when the self-aligning coupled resonator filter circuit is in a first tuning mode, such that presence of said second tunable resonator does not influence tuning of said first tunable resonator; and
   setting the switching architecture to a second tuning state that connects the coupling capacitor in parallel with the second tunable resonator and isolates the second tunable resonator from the first tunable resonator for closed loop tuning of the second tunable resonator when the self-aligning coupled resonator filter circuit is in a second tuning mode, such that presence of said first tunable resonator does not influence tuning of said second tunable resonator.

11. A method according to claim 10, further comprising setting the switching architecture to a run state that connects the output of the first tunable resonator to the input of the second tunable resonator via the coupling capacitor.

12. A method according to claim 11, wherein:

setting the switching architecture to said run state connects an input of the first resonator to a circuit input node of the self-aligning coupled resonator circuit.

13. A method according to claim 10, wherein:

setting the switching architecture to said first tuning state disconnects an input of the first tunable resonator from a circuit input node of the self-aligning coupled resonator circuit.

14. A method according to claim 10, wherein tuning of said self-aligning coupled resonator circuit is performed at each power-up cycle of a system that includes said self aligning coupled resonator circuit.

15. A method according to claim 10, wherein tuning of said self-aligning coupled resonator circuit is performed each time a tuner channel is selected for said self-aligning coupled resonator circuit.

* * * * *

UNITED STATES PATENT AND TRADEMARK OFFICE
CERTIFICATE OF CORRECTION

PATENT NO.         : 7,512,391 B2
APPLICATION NO.    : 11/136752
DATED              : March 31, 2009
INVENTOR(S)        : Lester et al.

It is certified that error appears in the above-identified patent and that said Letters Patent is hereby corrected as shown below:

Column 14, line 51, insert --a-- before "second"

Signed and Sealed this

Third Day of November, 2009

David J. Kappos
*Director of the United States Patent and Trademark Office*